United States Patent
Takaku (10) Patent No.: US 11,315,897 B2
(45) Date of Patent: Apr. 26, 2022

(54) SUBSTRATE HAVING AN INSULATING LAYER WITH VARYING HEIGHT AND ANGLE

(71) Applicant: Kioxia Corporation, Tokyo (JP)

(72) Inventor: Satoru Takaku, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/002,143

(22) Filed: Aug. 25, 2020

(65) Prior Publication Data
US 2021/0296273 A1 Sep. 23, 2021

(30) Foreign Application Priority Data
Mar. 19, 2020 (JP) .............. JP2020-050227

(51) Int. Cl.
| | | |
|---|---|---|
| H01L 23/053 | (2006.01) | |
| H01L 23/48 | (2006.01) | |
| H01L 23/28 | (2006.01) | |
| H01L 21/00 | (2006.01) | |
| H01L 21/44 | (2006.01) | |
| H05K 1/00 | (2006.01) | |
| B23K 31/02 | (2006.01) | |
| H01L 23/00 | (2006.01) | |
| H01L 23/488 | (2006.01) | |
| H01L 23/14 | (2006.01) | |
| H01L 23/538 | (2006.01) | |
| H01L 23/31 | (2006.01) | |
| H01L 23/498 | (2006.01) | |
| H01L 23/532 | (2006.01) | |

(52) U.S. Cl.
CPC .............. *H01L 24/14* (2013.01); *H01L 23/14* (2013.01); *H01L 23/3128* (2013.01); *H01L 23/488* (2013.01); *H01L 23/49816* (2013.01); *H01L 23/5329* (2013.01); *H01L 23/5385* (2013.01); *H01L 23/5386* (2013.01); *H01L 24/81* (2013.01)

(58) Field of Classification Search
CPC ......... H01L 24/14; H01L 24/17; H01L 24/81; H01L 23/14; H01L 23/488; H01L 23/5385; H01L 23/5386; H01L 23/3128; H01L 23/49816; H01L 23/5329; H01L 24/16
See application file for complete search history.

(56) References Cited

U.S. PATENT DOCUMENTS

7,355,279 B2 * 4/2008 Ke ..................... H01L 24/11
257/737
8,513,814 B2 8/2013 Daubenspeck et al.
(Continued)

*Primary Examiner* — Alonzo Chambliss
(74) *Attorney, Agent, or Firm* — Foley & Lardner LLP (57) ABSTRACT

A semiconductor package includes: a semiconductor element; a substrate provided with the semiconductor element on a first surface of the substrate, the substrate including a first wiring partially exposed on a second surface of the substrate opposite to the first surface; a first structure formed of an insulating film, or an insulating film and a metal portion, the first structure surrounding an exposed portion of the first wiring, the first structure having asymmetric height and angle; and a first electrode provided on the exposed portion of the first wiring.

20 Claims, 9 Drawing Sheets

(56) References Cited

U.S. PATENT DOCUMENTS

| | | | |
|---|---|---|---|
| 8,901,733 B2* | 12/2014 | Huang | H01L 24/03 |
| | | | 257/736 |
| 2005/0263883 A1 | 12/2005 | Wang et al. | |
| 2006/0113681 A1* | 6/2006 | Jeong | B23K 3/0623 |
| | | | 257/780 |
| 2011/0266670 A1* | 11/2011 | England | H01L 24/05 |
| | | | 257/738 |
| 2015/0001738 A1* | 1/2015 | Shimizu | H01L 21/4857 |
| | | | 257/778 |
| 2016/0254240 A1* | 9/2016 | Chen | H01L 23/3128 |
| | | | 257/738 |
| 2018/0182725 A1* | 6/2018 | Shindo | H01L 24/05 |

* cited by examiner

SUBSTRATE HAVING AN INSULATING LAYER WITH VARYING HEIGHT AND ANGLE

CROSS-REFERENCE TO RELATED APPLICATION(S)

This application is based upon and claims the benefit of priority from Japanese Patent Application No. 2020-050227, filed Mar. 19, 2020, the entire contents of which are incorporated herein by reference.

FIELD

Embodiments described herein relate generally to a semiconductor package.

BACKGROUND

There is a semiconductor device in which a semiconductor package in which semiconductor chips are stacked is mounted on a substrate. When the semiconductor device is driven, a crystal of a solder between the semiconductor package and the substrate may be coarsened and deformed by heat generated.

DETAILED DESCRIPTION

At least one embodiment provides a highly reliable semiconductor package.

In general, according to at least one embodiment, the semiconductor package includes: a semiconductor element; a substrate provided with the semiconductor element on a first surface of the substrate, the substrate including a first wiring partially exposed on a second surface of the substrate opposite to the first surface; a first structure formed of an insulating film, or an insulating film and a metal portion, the first structure surrounding an exposed portion of the first wiring, the first structure having an asymmetric height and angle; and a first electrode provided on the exposed portion of the first wiring.

Hereinafter, embodiments will be described with reference to the drawings.

In this specification, examples of a plurality of expressions are attached to some elements. The examples of these expressions are merely examples, and are not limiting of the above elements being expressed otherwise. In addition, an element to which the plurality of expressions are not attached may be expressed by at least another expression.

In addition, the drawings are schematic, and a relationship between a thickness and a planar dimension, a thickness ratio of layers, or the like may differ from an actual one. In addition, the drawings may include a portion in which dimensional relationships or ratios are different between the drawings. In addition, in the drawings, some reference signs are omitted.

First Embodiment

Figure 1:
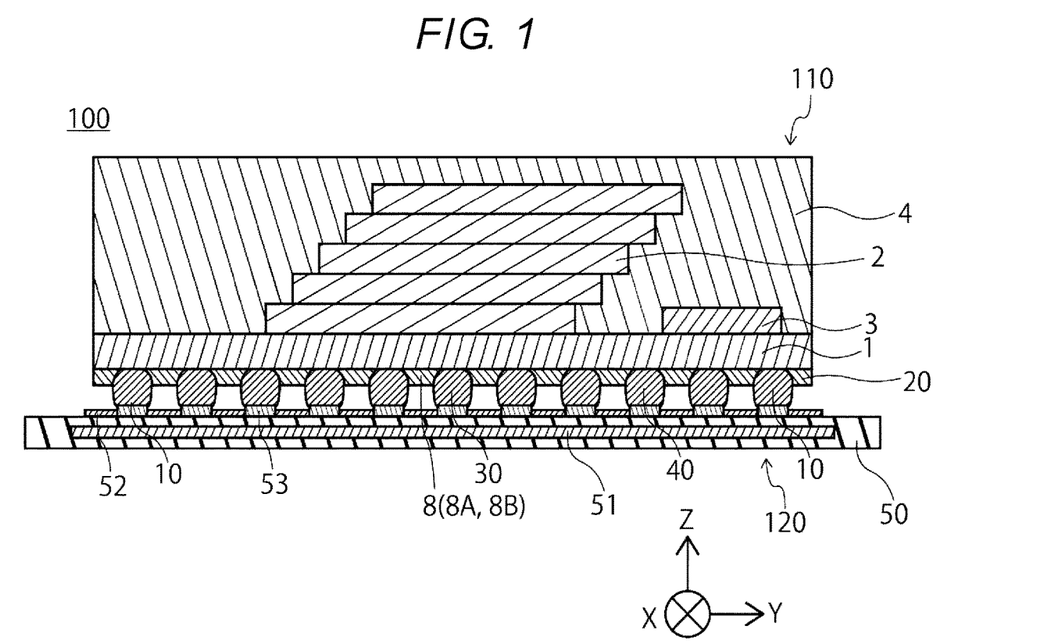
FIG. 1 is a conceptual sectional view of a semiconductor device according to at least one embodiment.

A first embodiment relates to a semiconductor device. FIG. 1 shows a conceptual sectional view of a semiconductor device 100. More specifically, the semiconductor device 100 of the embodiment has a semiconductor package, on which a semiconductor element such as a NAND flash memory chip is mounted, mounted on a printed circuit board. It is preferable that an X direction, a Y direction, and a Z direction intersect with each other and are orthogonal to each other. The semiconductor element mounted on the semiconductor package may be any other memory chip such as a DRAM, a controller chip such as a CPU, or the like.

The semiconductor device 100 of FIG. 1 is an example of a storage device. The semiconductor device 100 includes a semiconductor package 110 and a printed circuit board 120 on which the semiconductor package 110 is mounted. The semiconductor package 110 includes a wiring substrate 1, semiconductor elements (semiconductor memory chips 2 and a controller chip 3), a sealing material 4, a first structure 20 on an outer peripheral side, a second structure 8 and electrodes 10 (30, 40) on a central side. The printed circuit board 120 includes a substrate 50, a wiring layer 51, a structure 52, and pad electrodes 53 that are terminals. The semiconductor package 110 is more specifically a package called a fan out wafer level package (FOWLP). A large number of substantially columnar electrodes join electrodes on a bottom surface of the semiconductor package 110 and electrodes of the printed circuit board 120.

The wiring substrate 1 is a support substrate for the semiconductor memory chips 2 and the controller chip 3 which are the semiconductor elements. The wiring substrate 1 is, more specifically, a multilayer wiring substrate. The semiconductor memory chips 2 and the controller chip 3 are provided on a first surface side of the wiring substrate 1. A second surface side of the wiring substrate 1, facing a first surface, is provided with the substantially columnar electrodes for connecting to the printed circuit board 120 outside the semiconductor package 110 connected to pads of the wiring substrate 1.

The wiring substrate 1 is electrically connected to the semiconductor memory chips 2 and the controller chip 3 via a bonding wire (not shown). One or more semiconductor memory chips 2 are provided on the wiring substrate 1. The semiconductor memory chips 2 may be semiconductor chips that read and write data. As a nonvolatile memory chip, a NAND memory chip, a phase change memory chip, a resistance change memory chip, a ferroelectric memory chip, a magnetic memory chip, or the like may be used. As a volatile memory chip, a dynamic random access memory (DRAM) or the like may be used. When two or more semiconductor memory chips 2 are provided, it is preferable that the semiconductor memory chips 2 are semiconductor chips including the same circuit and the same structure except for individual differences. In addition, in at least one embodiment, the nonvolatile memory chip or the volatile memory chip may be used as the semiconductor memory chips 2.

As shown in FIG. 1, when two or more semiconductor memory chips 2 are provided, the semiconductor memory chips 2 are preferably stacked in the Z direction while being displaced in the Y direction. When a plurality of semiconductor memory chips 2 are provided, the semiconductor memory chips 2 are connected to each other via the bonding wire (not shown).

A space between the semiconductor package 110 and the printed circuit board 120 may be sealed with a sealing material.

A space between the semiconductor memory chips 2 or a space between the semiconductor memory chip 2 and the wiring substrate 1 is preferably fixed with an adhesive resin film (not shown).

The controller chip 3 is a semiconductor chip that controls reading, writing, and erasing of the semiconductor memory chips 2. A form of a package may be that in which the semiconductor memory chips 2 are provided above or below the controller chip 3.

The sealing material 4 seals the semiconductor memory chips 2 and the controller chip 3. The sealing material 4 is, for example, a mold resin.

Figure 2:
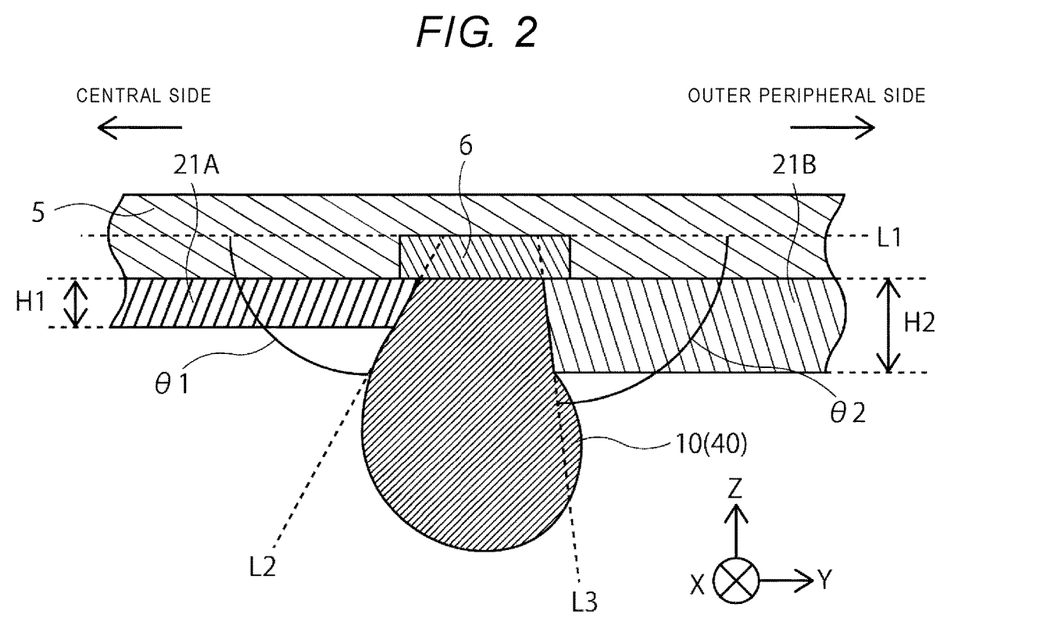
FIG. 2 is a partial conceptual diagram of the semiconductor device according to at least one embodiment.
Figure 3:
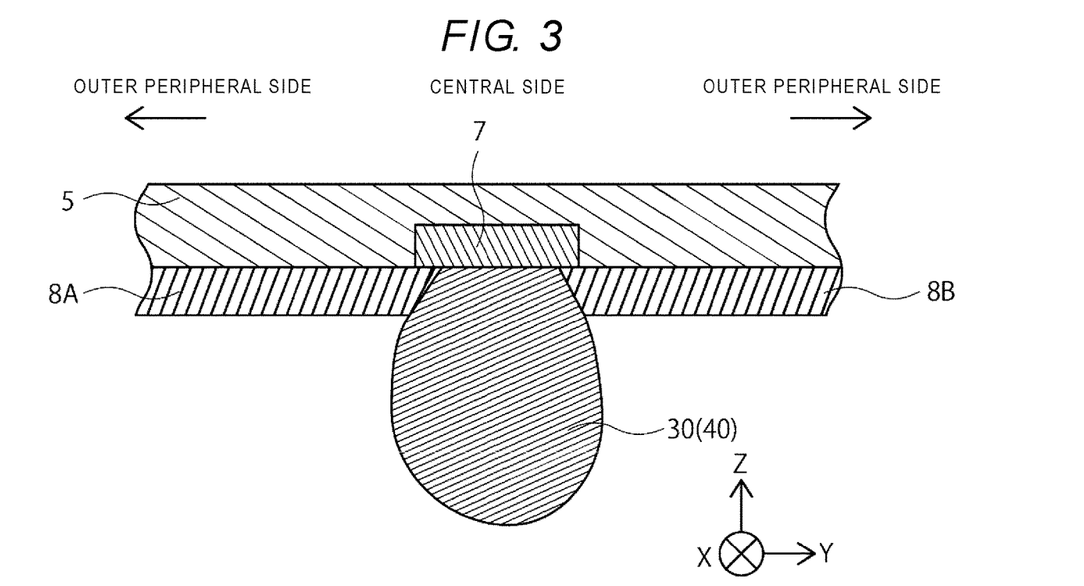
FIG. 3 is a partial conceptual diagram of the semiconductor device according to at least one embodiment.

FIGS. 2 and 3 are partial conceptual diagrams of the semiconductor device 100. The partial conceptual diagram of FIG. 2 shows an enlarged conceptual diagram of a portion of a first electrode 10 on the outer peripheral side of the semiconductor package 110. The partial conceptual diagram of FIG. 3 shows an enlarged conceptual diagram of a portion of a second electrode 30 on the central side of the semiconductor package 110. The conceptual diagram of FIG. 2 shows the wiring substrate 1 including an insulating layer 5 and a first wiring 6, a first structure 20, and hemispherical first electrode 10. The conceptual diagram of FIG. 3 shows the wiring substrate 1 including the insulating layer 5 and a second wiring 7, the second structure 8, and the hemispherical second electrode 30. If the first structure 20 or the second structure 8 is formed of a solder resist, a solder is formed on an upper surface of the first structure 20 or the second structure 8 so as not to spread. FIGS. 2 and 3 show a state before the semiconductor package 110 and the printed circuit board 120 are joined.

Figure 4:
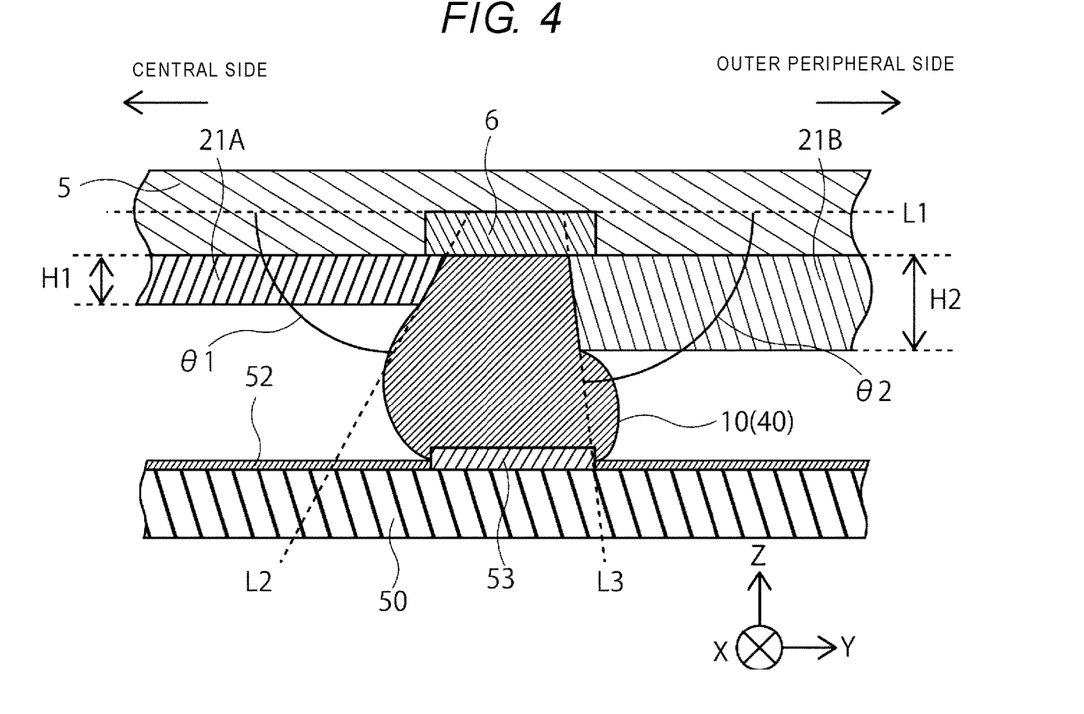
FIG. 4 is a partial conceptual diagram of the semiconductor device according to at least one embodiment.
Figure 5:
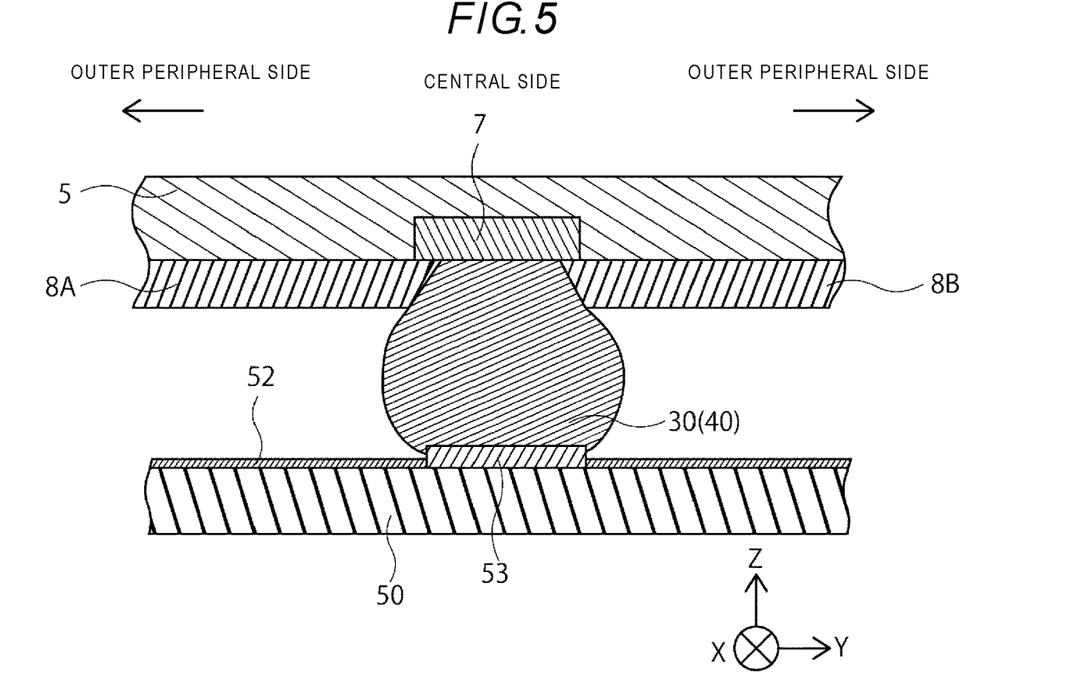
FIG. 5 is a partial conceptual diagram of the semiconductor device according to at least one embodiment.

FIG. 4 shows a partial conceptual diagram in which the semiconductor package 110 and the printed circuit board 120 are joined at a position corresponding to the partial conceptual diagram in FIG. 2. In a member shown in FIG. 4, the first electrode 10 has an asymmetrical cross-sectional shape, and the first electrode 10 is connected to the pad electrode 53 of the printed circuit board 120. FIG. 5 shows a partial conceptual diagram in which the semiconductor package 110 and the printed circuit board 120 are joined at a position corresponding to the partial conceptual diagram in FIG. 3. In a member shown in FIG. 5, the second electrode 30 has a symmetrical or substantially symmetrical cross-sectional shape, and the second electrode 30 is connected to the pad electrode 53 of the printed circuit board 120.

The first wiring 6 and the second wiring 7 are exposed on the second surface side, opposite to the first surface of the wiring substrate 1, and the exposed portions are surrounded by the first structure 20 and the second structure 8, respectively.

The first wiring 6 and the second wiring 7 are wirings of the wiring substrate 1 or dummy wirings. In a case of the dummy wiring, although the wiring is not electrically connected to the semiconductor elements, since the first electrode 10 and the second electrode 30 can increase a bonding strength with a substrate to be mounted, it is preferable to use the structure of at least one embodiment also for a hemispherical electrode of the dummy wiring. The first wiring 6 is exposed on an outer peripheral side of a second surface of the wiring substrate 1. The second wiring 7 is exposed on a central side of the second surface of the wiring substrate 1.

The first wiring 6 is electrically connected to the first electrode 10. It is preferable that the first wiring 6 is directly connected to the first electrode 10. The second wiring 7 is electrically connected to the second electrode 30. It is preferable that the second wiring 7 is directly connected to the second electrode 30. The first wiring 6 and the second wiring 7 may be formed of a metal or alloy conductor. The first wiring 6 and the second wiring 7 may be, for example, Cu wiring, and the exposed surfaces thereof may be plated.

The first structure 20 may be formed of an insulating film, or an insulating film and a metal portion, surrounding the exposed portion of the first wiring 6, and has an asymmetric height and angle. The insulating film of the first structure 20 is provided on a surface of the second surface of the wiring substrate 1. The insulating film of the first structure 20 may also cover an outer peripheral portion of the exposed portion of the first wiring 6. The metal portion of the first structure 20 is preferably provided on the insulating film of the first structure 20.

The insulating film of the first structure 20 is preferably a solder resist including a filler and a resin, for example. The insulating film of the first structure 20 may be a single-layer structure or a stacked structure. The angle and height of the first structure 20 may be asymmetric by changing a thickness of the insulating film or stacking insulating films having different shapes.

The height of the first structure 20 being asymmetric means that a height H1 of the first structure 20 on the central side of the center of the first wiring is different from a height H2 of the first structure 20 on the outer peripheral side in across section perpendicular to the wiring substrate 1 through a virtual line extending from a center of the first wiring 6 toward a central direction of the substrate.

The height H2 of the first structure 20 on the outer peripheral side is preferably 1.1 times or more the height H1 of the first structure 20 on the central side (H2≥1.1×H1), and is more preferably 1.5 times or more the height H1 (H2≥1.5× H1). Since a thickness of the package becomes too thick when the height of the first structure 20 on the outer peripheral side is too high, the height H2 of the first structure 20 on the outer peripheral side is preferably 3 times or less the height H1 of the first structure 20 on the central side (H2≤3×H1). When the first structure 20 on the outer peripheral side is not provided on the virtual line extending from the center of the first wiring 6 toward the central direction of the substrate, an angle of the virtual line is adjusted so as to extend to the first wiring 6.

The angle of the first structure 20 being asymmetric means that in the cross section perpendicular to the wiring substrate 1 through the virtual line extending from the center of the first wiring 6 toward the central direction of the wiring substrate 1, an angle θ1 on the central side of the first structure 20 formed by a first virtual line L1 and a second virtual line L2 is different from an angle θ2 on the outer peripheral side of the first structure 20 formed by the first virtual line L1 and a third virtual line L3, where the first virtual line L1 is a boundary between the insulating layer 5 and the first wiring 6 of the wiring substrate 1, the second virtual line L2 is a line connecting an upper end and a lower end of a surface facing the outer peripheral side of the first structure 20 on the central side, and the third virtual line L3 is a line connecting an upper end and a lower end of a surface facing the central side of the first structure 20 on the outer peripheral side. A difference between the angle θ2 of the first structure 20 on the outer peripheral side and the angle θ1 of the first structure 20 on the central side is preferably 5° or more, and more preferably 10° or more.

The angle θ2 of the first structure 20 on the outer peripheral side is preferably larger than the angle θ1 of the first structure 20 on the central side. Specifically, the angle θ2 of the first structure 20 on the outer peripheral side is preferably 1.1 times or more the angle θ1 of the first structure 20 on the central side (H2≥1.1×H1), and is more preferably 1.5 times or more the height H1 (H2≥1.5×H1). Since production becomes difficult when the angle θ of the first structure 20 on the outer peripheral side is too large, the angle θ2 of the first structure 20 on the outer peripheral side is preferably 3 times or less the angle θ1 of the first structure 20 on the central side (H2≤3×H1).

The angle θ1 of the first structure 20 on the central side is preferably less than 90°.

The angle θ2 of the first structure 20 on the outer peripheral side is preferably 80° or more, more preferably 90° or more, and even more preferably 100° or more. When the first structure 20 on the outer peripheral side is not provided on the virtual line extending from the center of the first wiring 6 toward the central direction of the substrate, the angle of the virtual line is adjusted so as to extend to the first wiring 6.

The first structure 20 shown in the conceptual diagram of FIG. 2 is formed of an insulating film 21A on the central side and an insulating film 21B on the outer peripheral side. The insulating film 21B on the outer peripheral side is thicker and has a larger angle than the insulating film 21A on the central side, and both the thickness and the angle of the first structure 20 are asymmetric.

The second structure 8 surrounding the second wiring 7 shown in the conceptual diagram of FIG. 3 is preferably configured such that at least one of the thickness and the angle is symmetrical. The second structure 8 surrounding the second wiring 7 is further preferably configured such that both the thickness and the angle are symmetrical.

Similar to the insulating film of the first structure 20, the second structure 8 is preferably a solder resist including a filler and a resin. The second structure 8 can be formed by a process the same as the first structure 20 on the central side. In this case, the insulating film of the second structure 8 may have a material, a height, and an angle (an angle with respect to the insulating layer 5) which is the same as the first structure 20 on the central side.

When the second wiring 7 is disposed in a center of the wiring substrate 1, the second structure 8 is configured such that in a cross section of a longitudinal direction of the wiring substrate 1 passing through the center of the second wiring 7, as shown in the conceptual diagram of FIG. 3, the insulating film 8A has a shape obtained by inverting the insulating film 8B, and at least the thickness and the angle are symmetrical. When the second wiring 7 is disposed outside the center of the wiring substrate 1, one insulating film 8A of the second structure 8 has the shape obtained by inverting the insulating film 8B, and at least the thickness and the angle are symmetrical.

(A) In a case of the semiconductor device including the semiconductor memory chips 2, since the semiconductor memory chips 2 are large and are formed on a hard Si substrate, a central portion of the semiconductor package 110 is difficult to deform due to thermal expansion. However, since there are many sealing materials 4 on the outer peripheral side, an outer side of the semiconductor package 110 is likely to warp from the first surface side of the wiring substrate 1 toward a direction on a semiconductor memory chip 2 side due to heat. When the outer peripheral side of the semiconductor package 110 is warped in this way, a joined solder on the outer peripheral side of the semiconductor package 110 extends vertically and horizontally between the printed circuit board 120 and the semiconductor package 110, so that an expansion/shear stress is applied to the solder on the outer peripheral side. When operation time of the semiconductor device 100 becomes long, expansion and contraction are repeated, with an effect that the warp becomes large in a solder portion on the outer peripheral side of the substrate.

Figure 6:
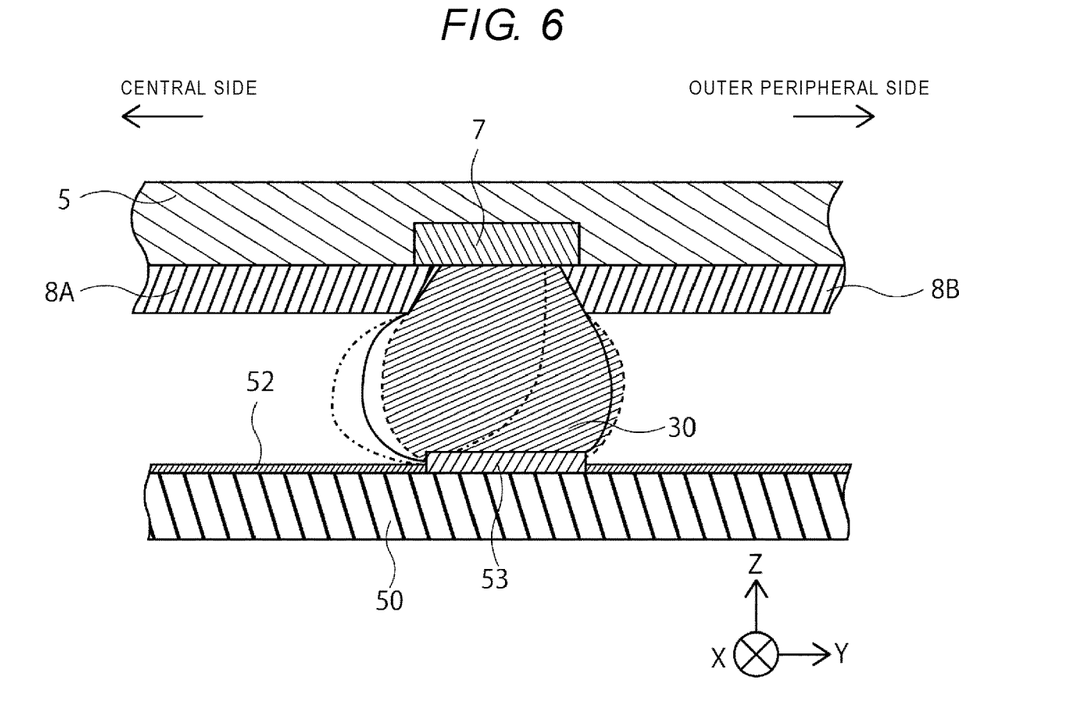
FIG. 6 is a partial conceptual diagram of the semiconductor device according to at least one embodiment.

The effect of the warp will be described in detail. First, a comparative example in which the second structure 8 is adopted from an outer peripheral portion to a central portion in joining the semiconductor package 110 and the printed circuit board 120 will be described. FIG. 6 exemplifies a joint portion in an outermost peripheral portion between the semiconductor package 110 and the printed circuit board 120 in the comparative example. A shape of the solder indicated by a broken line shows a case where the operation time is short and close to immediately after joining, and a shape of the solder indicated by a solid line shows a case where the operation time is long. As described above, when the semiconductor package 110 is repeatedly deformed by thermal expansion and contraction, a crystal of the solder is coarsened by a stress and is deformed so as to expand toward a center. When the solder deforms, a joining area with the pad is reduced. When the joining area is reduced, the stress of deformation is more likely to be locally concentrated, and the deformation of the solder further progresses. When such a cycle progresses and the operating time becomes longer, the deformation of the solder progresses as shown by a dash-dotted line, and the pad and the solder may be partly separated from each other on the outer peripheral side. In addition, a small crystal of the solder is likely to be deformed, but a big crystal of the solder is difficult to deform, and is therefore likely to be cracked. When coarsening of the crystal of the solder progresses, a strength of the solder may be reduced and the solder itself may be cracked.

Therefore, in the first electrode 10 on the outer peripheral side of the wiring substrate 1 in which the deformation of the solder is remarkable, the first structure 20 surrounding the first electrode is provided such that the stress is applied also from the outer peripheral side. Thus, the stress applied to the solder from the central side and the outer peripheral side becomes uniform, and the deformation such that the solder expands in only one direction is prevented. Thus, reliability of the semiconductor device 100 is improved.

Figure 7:
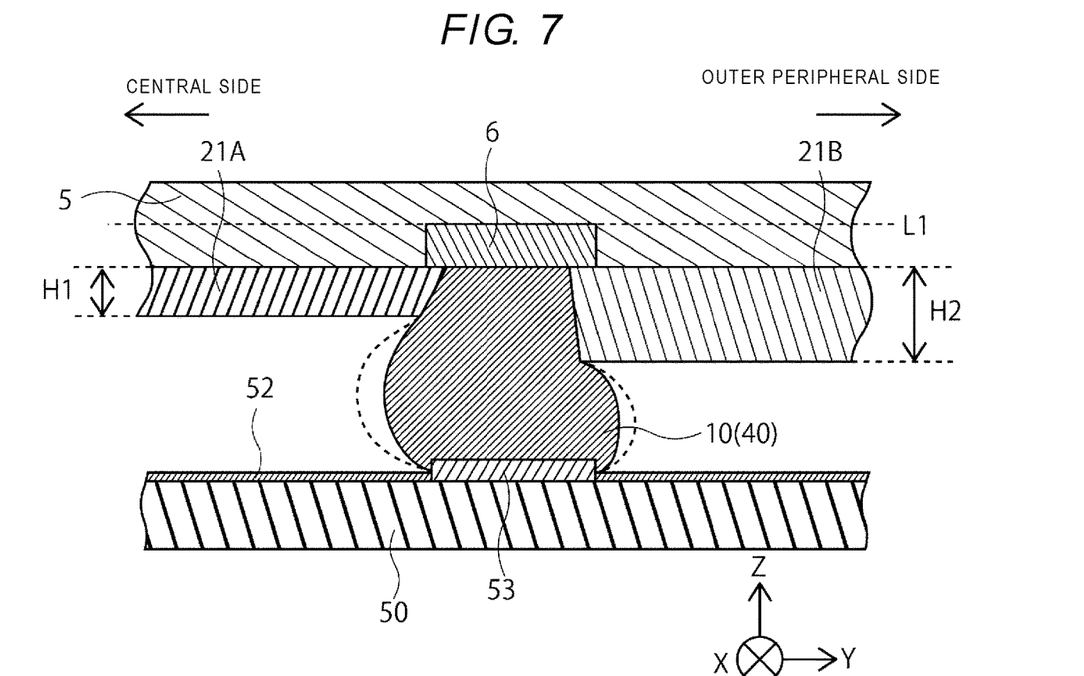
FIG. 7 is a partial conceptual diagram of the semiconductor device according to at least one embodiment.

Such a situation is shown in FIG. 7. When a thermal history is repeated, the shape of the solder is deformed from the solid line to the broken line such that the solder is also sandwiched on a first structure 21B side. In this way, the solder is not deformed only on the central side and is also deformed on the outer peripheral side, so that the separation of the pad and the solder can be prevented.

(B) Since the substrate is difficult to warp on the central side, the expansion/shear stress applied to the solder is small. Therefore, on the central side, the second structure 8 is adopted instead of the first structure 20 as shown in FIG. 2. Thus, the reliability of the semiconductor device 100 can be further improved.

(C) A structure around the wiring of the wiring substrate 1 in contact with a third electrode 40 disposed between the outer peripheral side and the central side can adopt either the structure of the first structure 20 or the second structure 8. Since the warp varies depending on a configuration of the semiconductor device 100 including the semiconductor element or the sealing material, by adopting the first structure 20 at an appropriate position according to the configuration of the semiconductor device, the reliability when the semiconductor device 100 is mounted can be improved.

(D) By adopting a structure the same as the first structure 20 so as to surround the pad electrode 53 also on a printed circuit board 120 side, it is possible to further prevent the deformation of the solder and the coarsening of the crystal of the solder.

Second Embodiment

Figure 8:
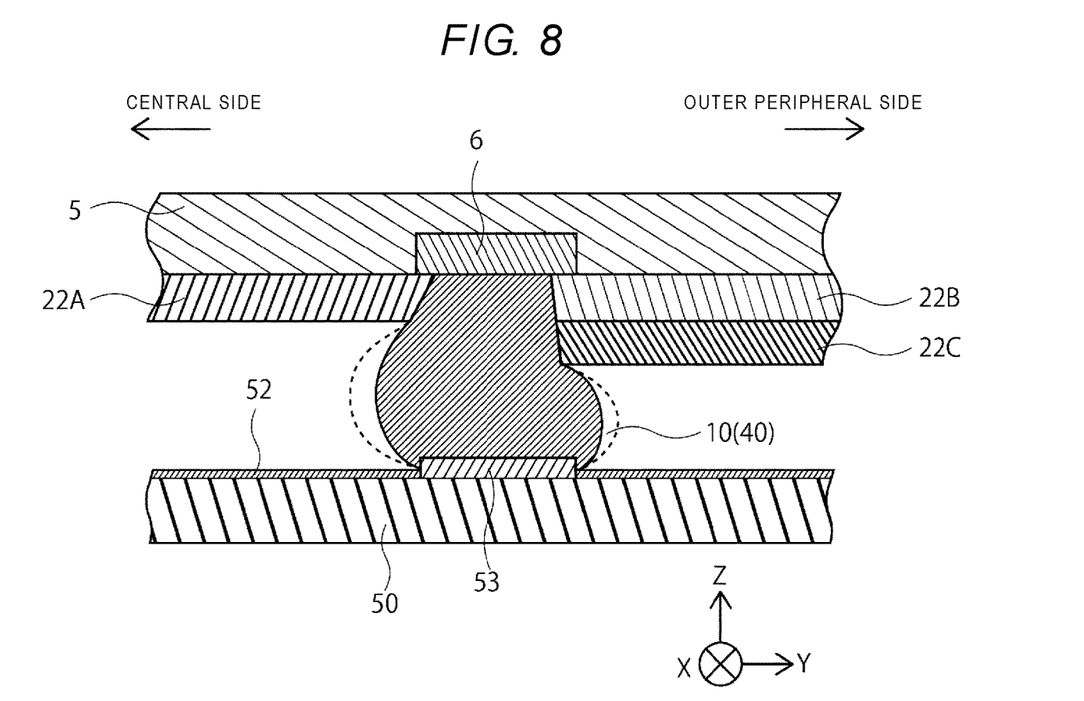
FIG. 8 is a partial conceptual diagram of the semiconductor device according to at least one embodiment.

A second embodiment relates to a semiconductor device. The semiconductor device of the second embodiment is a modification of the semiconductor device 100 of the first embodiment. Descriptions of contents common in the second embodiment and the first embodiment will be omitted. FIG. 8 shows an enlarged conceptual diagram of a portion of the first electrode 10 on the outer peripheral side of the semiconductor device 100 of the second embodiment. FIG. 8 shows a state (the solid line) immediately after joining the semiconductor package 110 and the printed circuit board 120 and a state (the broken line) in which the thermal history is repeated and the first electrode 10 which is the solder is deformed. In the second embodiment as well, the deformation of the solder (the first electrode 10) is prevented by adopting the asymmetric first structure 20 as in the first embodiment.

The first structure 20 of the second embodiment includes an insulating film 22A on the central side, and an insulating film 22B and an insulating film 22C that are stacked. A stacked body of the insulating film on the outer peripheral side and the insulating film 22A on the central side have asymmetric thicknesses and angles. The insulating film 22B is disposed between the wiring substrate 1 and the insulating film 22C. The insulating film 22B and the insulating film 22C have different thicknesses but the same angle. For example, by using a material having high hardness for the insulating film 22C, which is farther from the insulating layer 5 of the wiring substrate 1, it becomes easy to apply the stress to the solder from the outer peripheral side to the central side. By forming the insulating films of the first structure 20 on the outer peripheral side into the stacked body, the asymmetric first structure 20 can be formed by forming and processing the insulating film 22B on an insulating layer side of the wiring substrate 1 on the outer peripheral side and the insulating film 22A on the central side in the same process, and then stacking the insulating film 22C such that at least the angle is different from that of the insulating film 22B.

Third Embodiment

Figure 9:
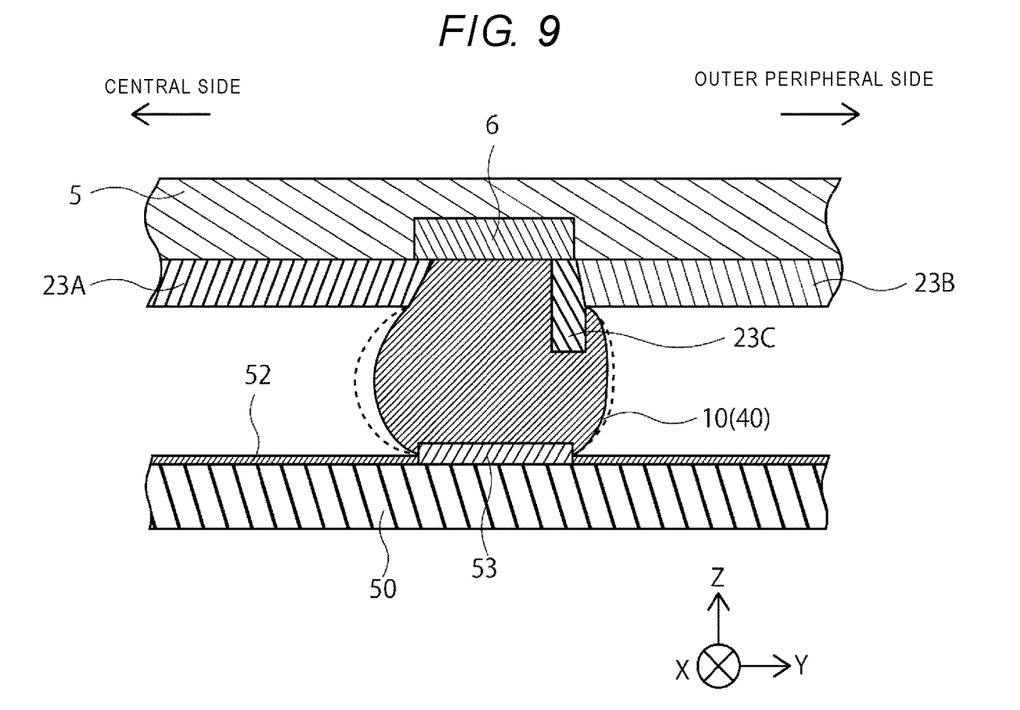
FIG. 9 is a partial conceptual diagram of the semiconductor device according to at least one embodiment.
Figure 10:
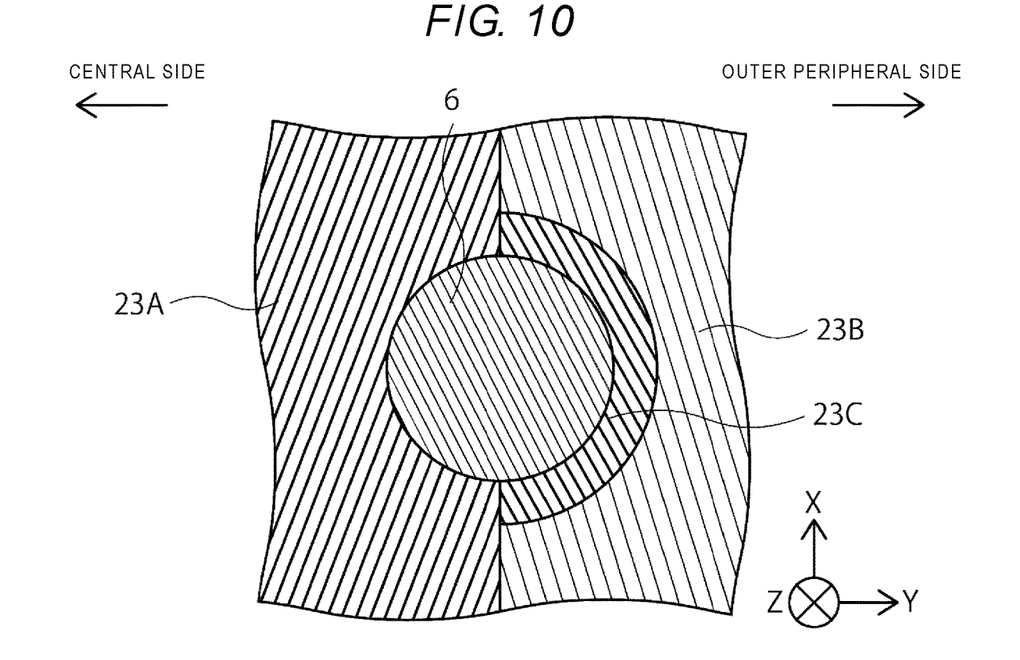
FIG. 10 is a partial conceptual diagram of the semiconductor device according to at least one embodiment.

A third embodiment relates to a semiconductor device. The semiconductor device of the third embodiment is a modification of the semiconductor device 100 of the first embodiment and the second embodiment. Descriptions of contents common in the third embodiment and the first embodiment or the second embodiment will be omitted. FIGS. 9 and 10 show enlarged conceptual diagrams of the portion of the first electrode 10 on the outer peripheral side of the semiconductor device 100 of the third embodiment. FIG. 10 shows a conceptual diagram in which the second surface side of the wiring substrate 1 is observed from the Z direction. The first electrode 10 is not shown in the conceptual diagram of FIG. 10. FIG. 9 shows the state (the solid line) immediately after joining the semiconductor package 110 and the printed circuit board 120 and the state (the broken line) in which the thermal history is repeated and the first electrode 10 which is the solder is deformed. In the third embodiment as well, the deformation of the solder (the first electrode 10) is prevented by adopting the asymmetric first structure 20 as in the first embodiment.

The first structure 20 of the third embodiment includes an insulating film 23A on the central side, and an insulating film 23B and a metal portion 23C. The metal portion is indirect contact with the exposed portion of the first wiring 6 and is in direct contact with the insulating film 23C.

As shown in FIG. 10, the metal portion 23C is provided on the outer peripheral side but not on the central side. A convex portion on the outer peripheral side of the first structure 20 may be formed in a part around the first wiring 6 as shown in FIG. 10, and when the first structure 20 is provided only on an outermost peripheral electrode, the convex portion (the insulating film 22C of the second embodiment, 23C of the third embodiment) of the first structure 20 can be entirely provided on the outer peripheral side.

The metal portion 23C of the first structure 20 is preferably a member having a Young's modulus higher than that of the first wiring 6. When the metal portion 23C is formed of a hard metal, the stress applied to the solder is likely to be large, so that a deterioration of the solder can be further prevented. The metal portion 23C is preferably a Ni alloy such as Ni—Au or Ni—Pd—Au. The metal portion 23C can be formed by, for example, electrolytically plating such that a portion on which the metal portion 23C is not formed is covered by a resist.

Fourth Embodiment

Figure 11:
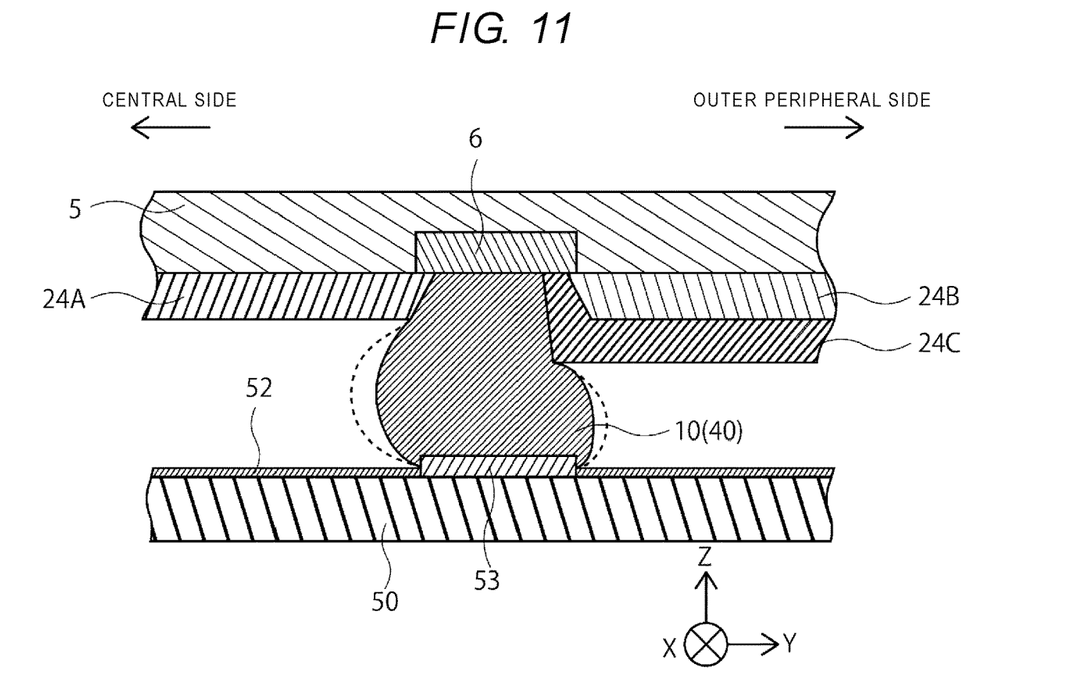
FIG. 11 is a partial conceptual diagram of the semiconductor device according to at least one embodiment.

A fourth embodiment relates to a semiconductor device. The semiconductor device of the fourth embodiment is a modification of the semiconductor device 100 of the first embodiment and the second embodiment. Descriptions of contents common in the fourth embodiment and the first embodiment or the second embodiment will be omitted. FIG. 11 shows an enlarged conceptual diagram of the portion of the first electrode 10 on the outer peripheral side of the semiconductor device 100 of the fourth embodiment. FIG. 11 shows the state (the solid line) immediately after joining the semiconductor package 110 and the printed circuit board 120 and the state (the broken line) in which the thermal history is repeated and the first electrode 10 which is the solder is deformed. In the fourth embodiment as well, the deformation of the solder (the first electrode 10) is prevented by adopting the asymmetric first structure 20 as in the first embodiment.

The first structure 20 of the fourth embodiment includes an insulating film 24A on the central side, and a stacked body of an insulating film 24B and an insulating film 24C on the outer peripheral side. The first structure 20 of the fourth embodiment is similar to the first structure 20 of the second embodiment, but is different from the second embodiment in that the insulating film 24C also covers a slope of the insulating film 24B provided on a wiring substrate 1 side. For example, the first structure 20 shown in the conceptual diagram of FIG. 11 can be formed by forming the insulating film 24A and the insulating film 24B in the same process and then forming the insulating film 24C on the outer peripheral side. The angle or height of the first structure 20 on the outer peripheral side can be adjusted under a forming condition including an exposure or removal process of the insulating film 24C.

Fifth Embodiment

Figure 12:
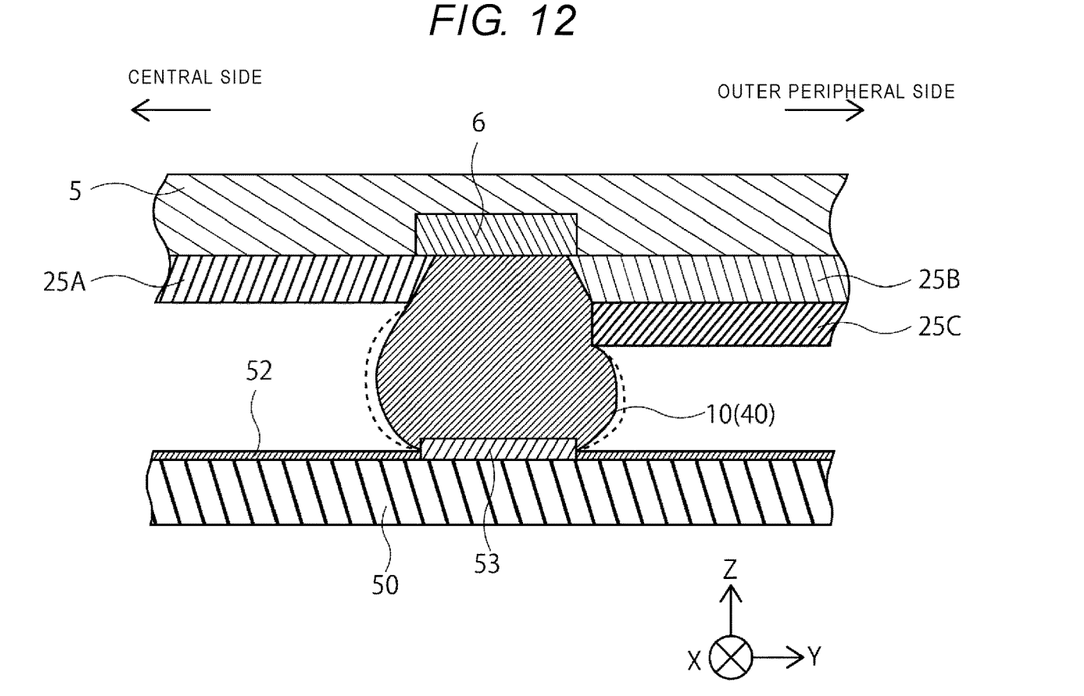
FIG. 12 is a partial conceptual diagram of the semiconductor device according to at least one embodiment.

A fifth embodiment relates to a semiconductor device. The semiconductor device of the fifth embodiment is a modification of the semiconductor device 100 of the first embodiment, the second embodiment and the fourth embodiment. Descriptions of contents common in the fifth embodiment and the first embodiment, the second embodiment or the fourth embodiment will be omitted. FIG. 12 shows an enlarged conceptual diagram of the portion of the first electrode 10 on the outer peripheral side of the semiconductor device 100 of the fifth embodiment. FIG. 12 shows the state (the solid line) immediately after joining the semiconductor package 110 and the printed circuit board 120 and the state (the broken line) in which the thermal history is repeated and the first electrode 10 which is the solder is deformed. In the fifth embodiment as well, the deformation of the solder (the first electrode 10) is prevented by adopting the asymmetric first structure 20 as in the first embodiment. The first structure 20 of the fifth embodiment includes an insulating film 25A on the central side, and a stacked body of an insulating film 25B and an insulating film 25C on the outer peripheral side. The first structure 20 of the fifth embodiment is similar to the first structure 20 of the second embodiment, but is different from the second embodiment in that the insulating film 25C in which at least an angle is different from that of the insulating film 25B is provided on the insulating film 25B. Slopes of the insulating films 25B and 25C are in contact with the first electrode 10, but the angles of both the insulating films are different.

Sixth Embodiment

Figure 13:
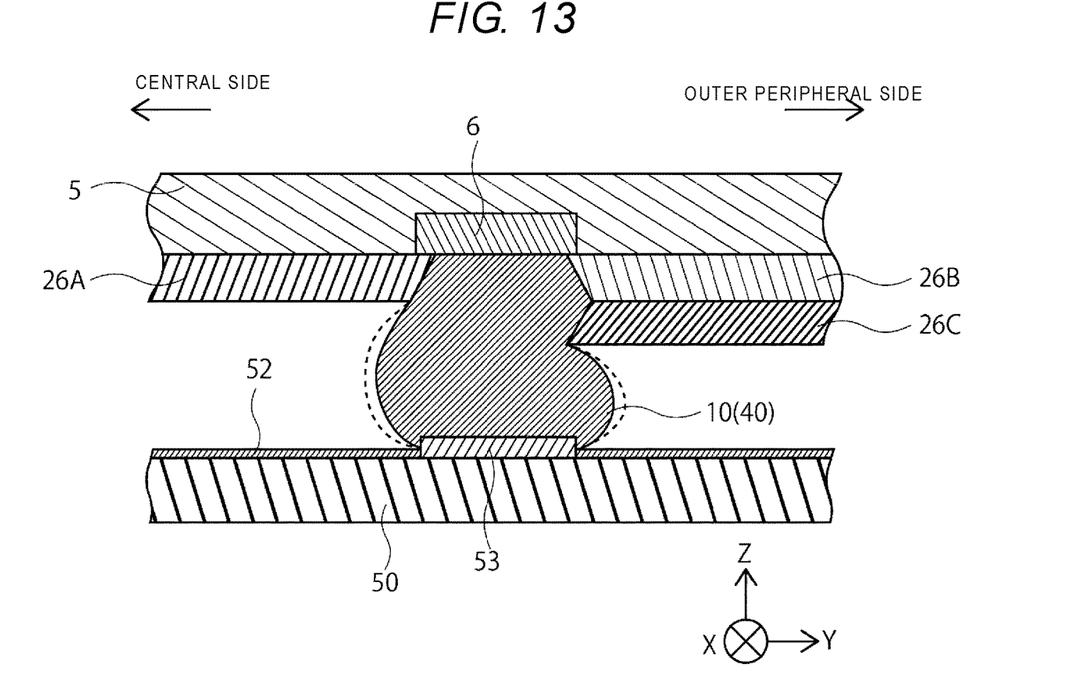
FIG. 13 is a partial conceptual diagram of the semiconductor device according to at least one embodiment.

A sixth embodiment relates to a semiconductor device. The semiconductor device of the sixth embodiment is a modification of the semiconductor device 100 of the first embodiment, the second embodiment, the fourth embodiment and the fifth embodiment. Descriptions of contents common in the sixth embodiment and the first embodiment, the second embodiment, the fourth embodiment or the fifth embodiment will be omitted. FIG. 13 shows an enlarged conceptual diagram of the portion of the first electrode 10 on the outer peripheral side of the semiconductor device 100 of the sixth embodiment. FIG. 13 shows the state (the solid line) immediately after joining the semiconductor package 110 and the printed circuit board 120 and the state (the broken line) in which the thermal history is repeated and the first electrode 10 which is the solder is deformed. In the sixth embodiment as well, the deformation of the solder (the first electrode 10) is prevented by adopting the asymmetric first structure 20 as in the first embodiment.

The first structure 20 of the sixth embodiment includes an insulating film 26A on the central side, and a stacked body of an insulating film 26B and an insulating film 26C on the outer peripheral side. The first structure 20 of the sixth embodiment is similar to the first structure 20 of the fifth embodiment, but is different from the fifth embodiment in that an angle of the insulating film 26C on the insulating film 26B is 90° or more. The insulating film 26C can apply a large stress to the solder than the insulating film 25C of the fifth embodiment. For example, when the insulating films having different angles are stacked as in the first structure 20 of the sixth embodiment, the angles are asymmetric in that the different angles are formed on the outer peripheral side.

Seventh Embodiment

Figure 14:
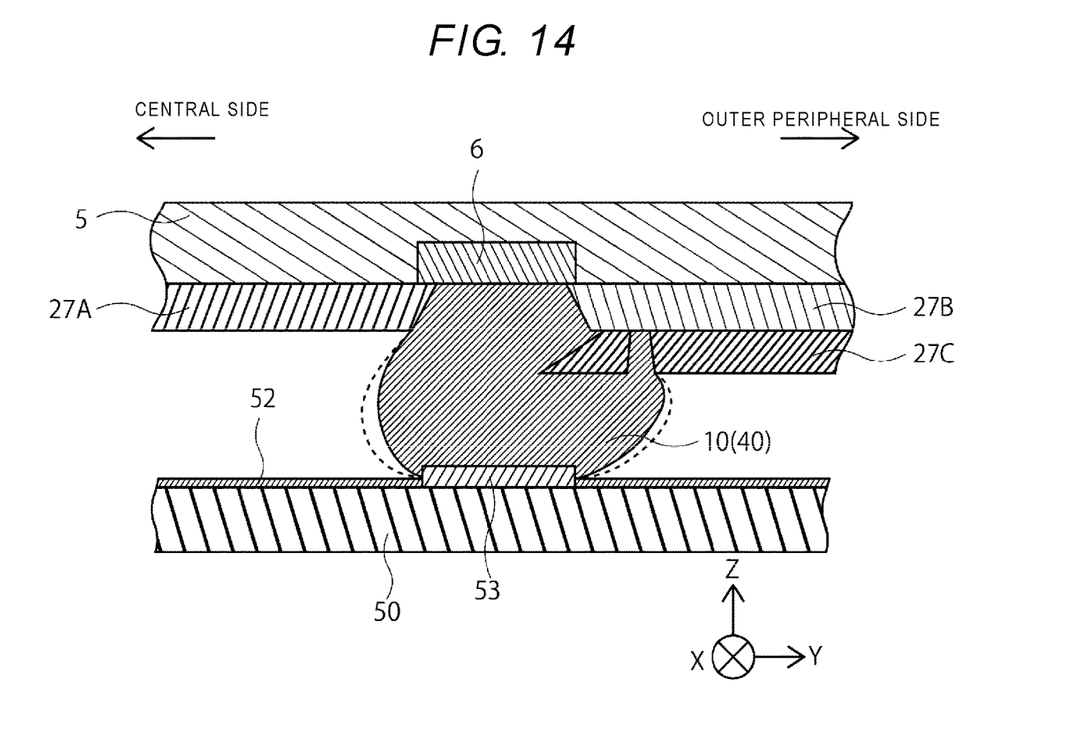
FIG. 14 is a partial conceptual diagram of the semiconductor device according to at least one embodiment.

A seventh embodiment relates to a semiconductor device. The semiconductor device of the seventh embodiment is a modification of the semiconductor device 100 of the first embodiment, the second embodiment, the fourth embodiment, the fifth embodiment and the sixth embodiment. Descriptions of contents common in the seventh embodiment and the first embodiment, the second embodiment, the fourth embodiment, the fifth embodiment or the sixth embodiment will be omitted. FIG. 14 shows an enlarged conceptual diagram of the portion of the first electrode 10 on the outer peripheral side of the semiconductor device 100 of the seventh embodiment. FIG. 14 shows the state (the solid line) immediately after joining the semiconductor package 110 and the printed circuit board 120 and the state (the broken line) in which the thermal history is repeated and the first electrode 10 which is the solder is deformed. In the seventh embodiment as well, the deformation of the solder (the first electrode 10) is prevented by adopting the asymmetric first structure 20 as in the first embodiment.

The first structure 20 of the seventh embodiment includes an insulating film 27A on the central side, and a stacked body of an insulating film 27B and an insulating film 27C on the outer peripheral side. The first structure 20 of the seventh embodiment is similar to the first structure 20 of the sixth embodiment, but is different from the sixth embodiment in that a part of a lower end surface of the insulating film 27B is exposed and the lower end surface of the insulating film 27B is in direct contact with the first electrode 10. Since an end of the insulating film 27C on the central side is located closer to the central side than an end of the insulating film 27B on the central side, a large stress can be applied to the solder. As shown in FIG. 14, a point of contact between the insulating films 27B and 27C on the central side may be displaced in the Y direction. In addition, the insulating film 27C may be divided, and a divided hole may be filled with the solder of the first electrode 10. When the first electrode 10 is filled in the divided hole, the stress is likely to concentrate to the divided hole, so that the stress from the outer peripheral side can be increased.

Eighth Embodiment

Figure 15:
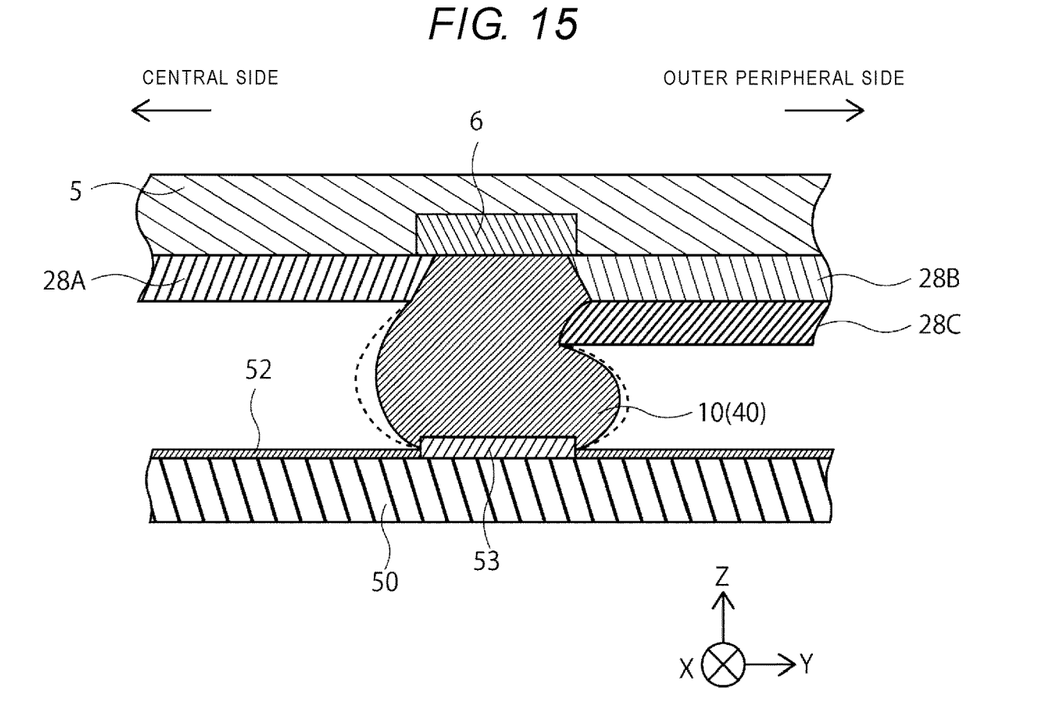
FIG. 15 is a partial conceptual diagram of the semiconductor device according to at least one embodiment.
Figure 16:
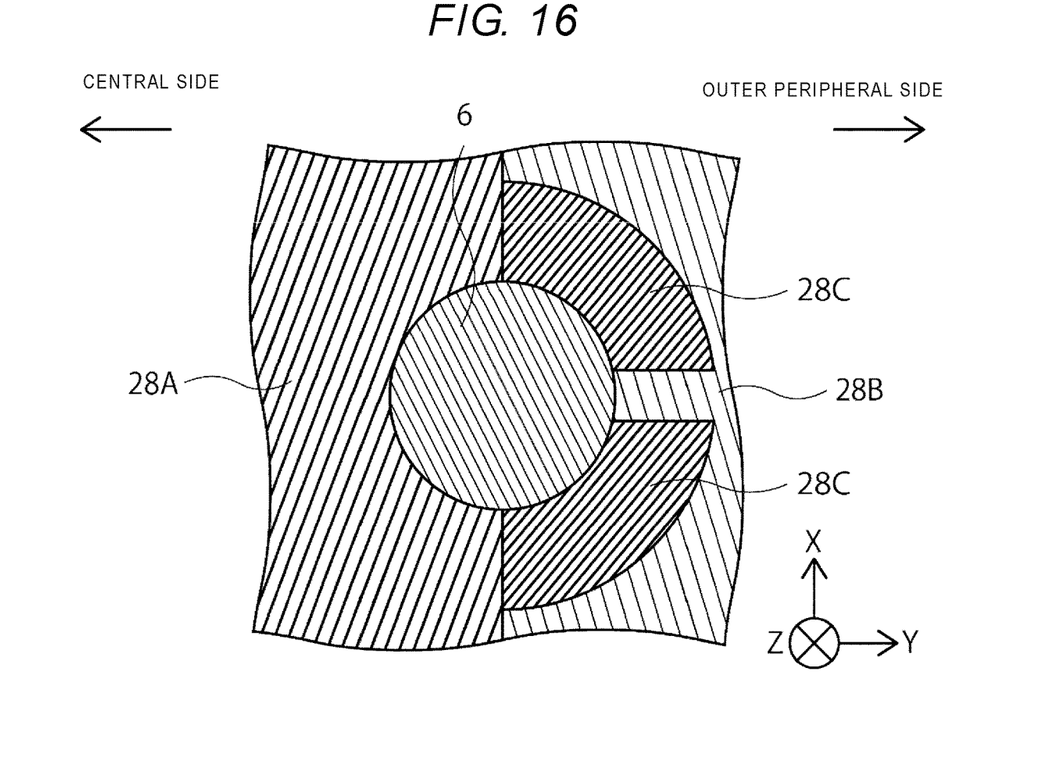
FIG. 16 is a partial conceptual diagram of the semiconductor device according to at least one embodiment.

An eighth embodiment relates to a semiconductor device. The semiconductor device of the eighth embodiment is a modification of the semiconductor device 100 of the first embodiment, the second embodiment, the fourth embodiment, the fifth embodiment, the sixth embodiment and the seventh embodiment. Descriptions of contents common in the eighth embodiment and the first embodiment, the second embodiment, the fourth embodiment, the fifth embodiment, the sixth embodiment or the seventh embodiment will be omitted. FIGS. 15 and 16 show enlarged conceptual diagrams of the portion of the first electrode 10 on the outer peripheral side of the semiconductor device 100 of the eighth embodiment. FIG. 15 shows the state (the solid line) immediately after joining the semiconductor package 110 and the printed circuit board 120 and the state (the broken line) in which the thermal history is repeated and the first electrode 10 which is the solder is deformed. In the eighth embodiment as well, the deformation of the solder (the first electrode 10) is prevented by adopting the asymmetric first structure 20 as in the first embodiment.

The first structure 20 of the eighth embodiment includes an insulating film 28A on the central side, and a stacked body of an insulating film 28B and an insulating film 28C on the outer peripheral side. The first structure 20 of the eighth embodiment is similar to the first structure 20 of the sixth embodiment, but is different from the sixth embodiment in that a surface facing a central side of the insulating film 28B on a lower side is a curved surface. During exposure when the insulating film 28C is formed, the first wiring 6 is likely to reflect light and thus is likely to be hardened, and a surface facing a central side of the insulating film 28C swells toward a first wiring 6 side.

In addition, as shown in FIG. 16, the insulating film 28C may be divided without drawing a continuous arc. Due to the division, the solder enters between the divided insulating films 28C and the stress is likely to be applied on the solder. The stress on the solder can be adjusted by adjusting a dividing position of the insulating film 28C or the like.

Ninth Embodiment

Figure 17:
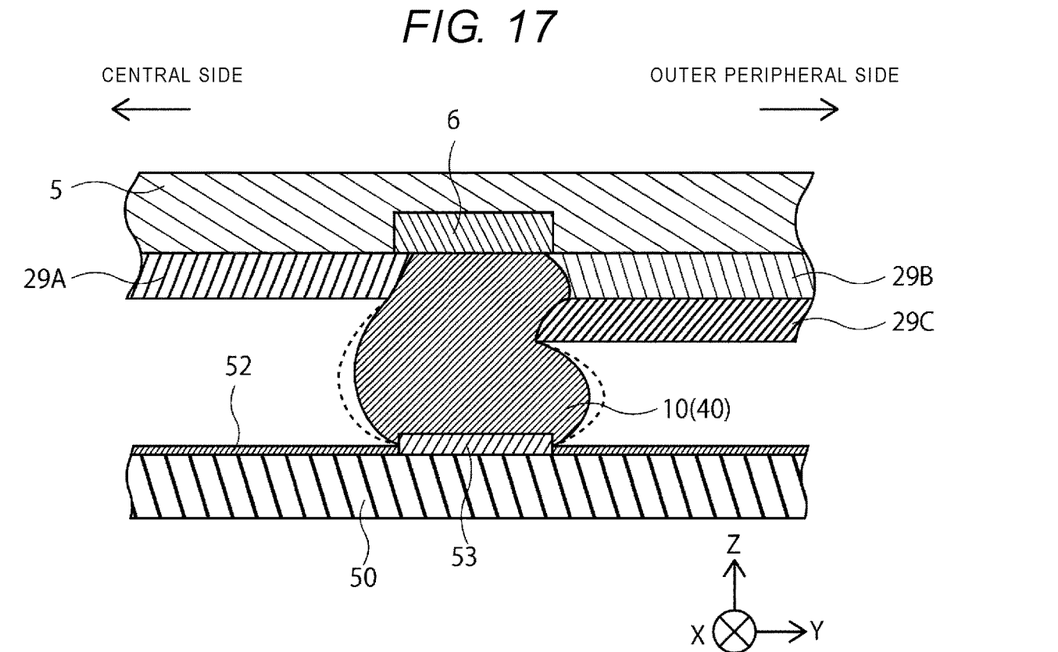
FIG. 17 is a partial conceptual diagram of the semiconductor device according to at least one embodiment.
Figure 18:
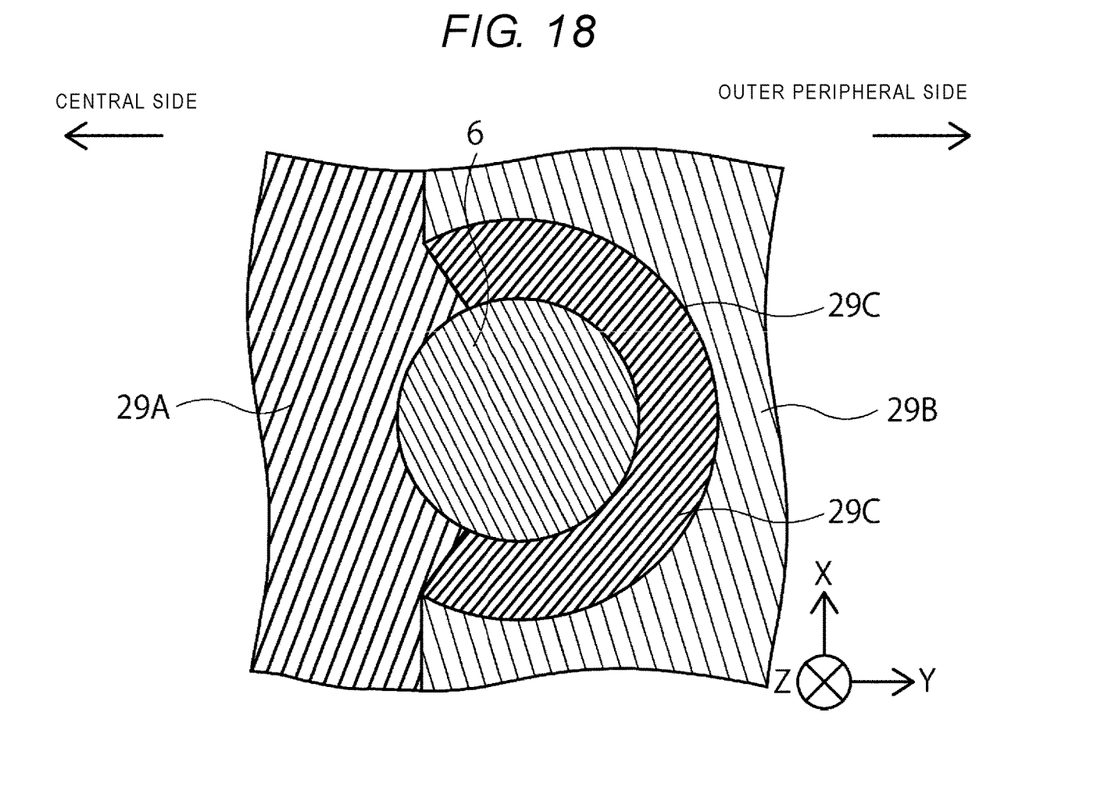
FIG. 18 is a partial conceptual diagram of the semiconductor device according to at least one embodiment.

A ninth embodiment relates to a semiconductor device. The semiconductor device of the ninth embodiment is a modification of the semiconductor device 100 of the first embodiment, the second embodiment, the fourth embodiment, the fifth embodiment, the sixth embodiment, the seventh embodiment and the eighth embodiment. Descriptions of contents common in the ninth embodiment and the first embodiment, the second embodiment, the fourth embodiment, the fifth embodiment, the sixth embodiment, the seventh embodiment or the eighth embodiment will be omitted. FIGS. 17 and 18 show enlarged conceptual diagrams of the portion of the first electrode 10 on the outer peripheral side of the semiconductor device 100 of the ninth embodiment. FIG. 17 shows the state (the solid line) immediately after joining the semiconductor package 110 and the printed circuit board 120 and the state (the broken line) in which the thermal history is repeated and the first electrode 10 which is the solder is deformed. In the ninth embodiment as well, the deformation of the solder (the first electrode 10) is prevented by adopting the asymmetric first structure 20 as in the first embodiment.

The first structure 20 of the ninth embodiment includes an insulating film 29A on the central side, and a stacked body of an insulating film 29B and an insulating film 29C on the outer peripheral side. The first structure 20 of the ninth embodiment is similar to the first structure 20 of the eighth embodiment, but is different from the eighth embodiment in that a surface facing a central side of the insulating film 29B on an upper side is a curved surface. In the exposure when the insulating film 29B is formed, the first wiring 6 is likely to reflect light and thus is likely to be hardened, and the surface facing the central side of the insulating film 29B swells toward the first wiring 6 side.

In addition, as shown in FIG. 18, the insulating film 29C may draw a donut-shaped arc having a central angle of 180° or more. The stress on the solder can be adjusted by adjusting the central angle of the insulating film 29C or the like. The insulating film 29C may draw the donut-shaped arc having a central angle of less than 180°.

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor package, comprising:
    a semiconductor element;
    a substrate provided with the semiconductor element on a first surface of the substrate, the substrate including a first wiring partially exposed on a second surface of the substrate opposite to the first surface;
    a first structure formed of an insulating film, or an insulating film and a metal portion, the first structure surrounding an exposed portion of the first wiring, the first structure having an asymmetric height and angle; and
    a first electrode disposed on the exposed portion of the first wiring, wherein
    a height of the first structure on an outer peripheral side of the substrate is 1.5 times or more and 3 times or less a height of the first structure on a central side, and
    a difference between an angle of the first structure on the outer peripheral side of the substrate and an angle of the first structure on the central side is 10° or more.

2. The semiconductor package according to claim 1, wherein the outer peripheral side of the substrate of the first structure is higher than the central side of the substrate.

3. The semiconductor package according to claim 1, wherein
    a height of the first structure on the outer peripheral side of the substrate is 1.1 times or more and 3 times or less a height of the first structure on the central side.

4. The semiconductor package according to claim 1, wherein the metal portion of the first structure is a metal or an alloy having a Young's modulus higher than that of the first wiring.

5. The semiconductor package according to claim 1, further comprising:
    a second wiring partially exposed on a central side of the second surface of the substrate;
    a second structure formed of an insulating film surrounding an exposed portion of the second wiring and having a symmetrical height and angle; and
    a hemispherical second electrode provided on the exposed portion of the second wiring.

6. The semiconductor package according to claim 5, wherein the hemispherical second electrode has a substantially symmetrical cross-sectional shape.

7. The semiconductor package according to claim 5, wherein the hemispherical second electrode is connected to a pad electrode of a printed circuit board.

8. The semiconductor package according to claim 5, wherein the second structure includes a solder resist.

9. The semiconductor package according to claim 1, wherein the insulating film includes stacked insulating films.

10. The semiconductor package according to claim 1, wherein the insulating film includes a solder resist.

11. The semiconductor package according to claim 1, wherein the semiconductor element includes a semiconductor chip.

12. The semiconductor package according to claim 1, wherein the first electrode includes a bump electrode.

13. A semiconductor package, comprising:
 a semiconductor element;
 a substrate provided with the semiconductor element on a first surface of the substrate, the substrate including a first wiring partially exposed on a second surface of the substrate opposite to the first surface;
 a first structure formed of an insulating film, or an insulating film and a metal portion, the first structure surrounding an exposed portion of the first wiring, the first structure having an asymmetric height and angle; and
 a first electrode disposed on the exposed portion of the first wiring, wherein
 a height of the first structure on an outer peripheral side of the substrate is 1.1 times or more and 3 times or less a height of the first structure on a central side.

14. The semiconductor package according to claim 13, wherein an outer peripheral side of the substrate of the first structure is higher than the central side of the substrate.

15. The semiconductor package according to claim 13, wherein
 a difference between an angle of the first structure on the outer peripheral side of the substrate and an angle of the first structure on the central side is 5° or more.

16. The semiconductor package according to claim 13, wherein the metal portion of the first structure is a metal or an alloy having a Young's modulus higher than that of the first wiring.

17. The semiconductor package according to claim 13, further comprising:
 a second wiring partially exposed on a central side of the second surface of the substrate;
 a second structure formed of an insulating film surrounding an exposed portion of the second wiring and having a symmetrical height and angle; and
 a hemispherical second electrode provided on the exposed portion of the second wiring.

18. The semiconductor package according to claim 17, wherein the hemispherical second electrode has a substantially symmetrical cross-sectional shape.

19. The semiconductor package according to claim 17, wherein the hemispherical second electrode is connected to a pad electrode of a printed circuit board.

20. The semiconductor package according to claim 17, wherein the second structure includes a solder resist.

* * * * *